United States Patent
Yu et al.

(10) Patent No.: US 6,809,408 B2
(45) Date of Patent: Oct. 26, 2004

(54) SEMICONDUCTOR PACKAGE WITH DIE PAD HAVING RECESSED PORTION

(75) Inventors: Chen Shih Yu, Taichung (TW); Chih-Jen Yang, Taichung (TW); Hung Jui-Hsiang, Changhua (TW); Chin Jeng Liu, Taichung (TW); Chen-Hsung Yang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 77 days.

(21) Appl. No.: 10/109,755

(22) Filed: Mar. 29, 2002

(65) Prior Publication Data

US 2003/0141575 A1 Jul. 31, 2003

(30) Foreign Application Priority Data

Jan. 31, 2002 (TW) .......................... 90101618 A

(51) Int. Cl.⁷ .................. H01L 23/495; H01L 23/48; H01L 23/52
(52) U.S. Cl. .................. 257/676; 257/666; 257/669; 257/787; 257/784
(58) Field of Search ................. 257/676, 666, 257/669, 787, 784, 670, 690

(56) References Cited

U.S. PATENT DOCUMENTS

| | | | | |
|---|---|---|---|---|
| 4,942,452 A | * | 7/1990 | Kitano et al. ............ | 357/58 |
| 5,233,222 A | | 8/1993 | Djennas et al. ........... | 257/676 |
| 5,327,008 A | * | 7/1994 | Djennas et al. ........... | 257/666 |
| 5,623,163 A | * | 4/1997 | Izumi ....................... | 257/667 |
| 5,661,338 A | * | 8/1997 | Yoo et al. ................. | 257/676 |
| 5,949,655 A | * | 9/1999 | Glenn ....................... | 361/783 |
| 6,274,927 B1 | * | 8/2001 | Glenn ....................... | 257/680 |

\* cited by examiner

*Primary Examiner*—Nitin Parekh
(74) *Attorney, Agent, or Firm*—Peter F. Corless; Steven M. Jensen; Edwards & Angell, LLP

(57) ABSTRACT

A semiconductor package with a die pad having a recessed portion is proposed, wherein a lead frame is used, having a die pad formed with at least a through hole, and a plurality of leads. A chip is mounted on the die pad and covers the through hole, with a bottom surface of the chip being partly exposed out the through hole. The through hole is formed at its peripheral edge with a recessed portion that dents from a top surface of the die pad and is associated with the through hole. During a molding process, the recessed portion is entirely filled with an encapsulating compound used for encapsulating the chip and die pad. This prevents forming of voids between the chip and die pad, and assures packaged products to be free of die crack or popcorn effect, thereby significantly improving yield and reliability of the packaged products.

13 Claims, 5 Drawing Sheets

US 6,809,408 B2

SEMICONDUCTOR PACKAGE WITH DIE PAD HAVING RECESSED PORTION

FIELD OF THE INVENTION

The present invention relates to semiconductor packages, and more particularly, to a lead-frame-based semiconductor package with a die pad that serves as a chip carrier and is formed with a through hole.

BACKGROUND OF THE INVENTION

Conventionally, a semiconductor package with a lead frame as a chip carrier is inherent with significant problems; for example, a die pad of the lead frame is relatively large in surface area, and weak in adhesion with an encapsulant that encapsulates a chip mounted on the die pad. This weak adhesion tends to cause delamination between the die pad and the encapsulant when the semiconductor package is subjected to reliability tests or temperature variation in subsequent processes, making reliability and quality of the semiconductor package adversely affected. Further, with relatively larger contact area between the die pad and the chip, during temperature cycles in fabrication processes, the chip would suffer greater thermal stress from the die pad, and easily causes chip cracking or delamination between the chip and the die pad in this conventional semiconductor package.

In order to solve the above problems, U.S. Pat. No. 5,233,222 discloses a semiconductor package with a die pad having a recessed portion. As shown in FIG. 4A, this semiconductor package 3 has a die pad 30 formed with a through hole 300. A chip 31 is adhered onto the die pad 30 by silver paste 32 in a manner that, the chip 31 covers the through hole 300, and a bottom surface 310 of the chip 31 is partly exposed out the through hole 300. This structure greatly decreases contact area between the chip 31 and the die pad 30, and effectively reduces thermal stress applied from the die pad 30 to the chip 31, so as to prevent the occurrence of chip cracking or delamination between the chip 31 and the die pad 30. Moreover, the through hole 300 formed through the die pad 30 further helps enhance adhesion between the die pad 30 and an encapsulant 33 for encapsulating the chip 31. Similarly, U.S. Pat. No. 5,327,008 teaches a semiconductor package having an approximately X-shaped die pad, which is purposed the same function for reducing contact area between a chip and the die pad as the former U.S. patent reference, and not to be further illustrated by drawings herein.

Even with provision of several benefits as detailed above for the foregoing two U.S. patents, nevertheless, it needs to take much effort to accurately control the amount of silver paste being applied on the die pad for attaching the chip thereon. When too much silver paste is used, as shown in FIG. 4B, excess silver paste 32 would flash downwardly from edge of the through hole 300 of the die pad 30, and consequently contaminate equipment and semiconductor products. On the other hand, if silver paste is not sufficiently applied, as shown in FIG. 4C, a gap 301 unfilled by silver paste would be left between the chip 31 and the die pad 30 nearby the through hole 300. This gap 301 is usually around 25.4 μm (1 mil) in dimension. An encapsulating resin for forming the encapsulant 33 may have its filler size larger than 25.4 μm, and cannot fill into the gap 301 during a molding process. As such, air trapped in the gap 301 is not able to be ventilated, but forms voids in the gap 301. The voids would easily cause cracks of the chip 31 at corresponding positions in subsequent fabrication processes. The occurrence of paste flash or void forming both detrimentally damages reliability and yield of fabricated products. Accordingly, if to precisely control the applied amount of silver paste, this would undesirably increase costs and process complexity of fabrication, but still cannot be proved to perfectly solve the problem of excess or insufficient usage of silver paste.

In response to the foregoing drawbacks, U.S. Pat. Nos. 4,942,452 and 5,150,193 respectively teach the forming of a groove on a die pad in a semiconductor package. As shown in FIG. 5, a die pad 40 of this semiconductor package 4 is formed with a groove 401 nearby a through hole 400 that penetrates through the die pad 40. The groove 401 is used to retain part of silver paste 42 applied on the die pad 40, and to prevent flash of silver paste 42 if being applied in excess. Thereby, the problem of silver paste 42 flashing into the through hole 400 can be effectively solved; however, if in provision of not enough silver paste 42, a gap 402 would be left between a chip 41 and the die pad 40, and forming of voids in the gap 402 is still a drawback undesirably pertained to the semiconductor package 4.

SUMMARY OF THE INVENTION

A primary objective of the present invention is to provide a semiconductor package, which effectively prevents void forming and flashing of silver paste from occurrence.

Another objective of the invention is to provide a method for fabricating a semiconductor package, which effectively prevents void forming and flashing of silver paste from occurrence.

In accordance with the above and other objectives, the present invention proposes a semiconductor package, comprising: a lead frame having a die pad and a plurality of leads, the die pad being formed with at least a through hole and a recessed portion that dents from a top surface of the die pad and is connected to the through hole; a chip mounted on the die pad by an adhesive in a manner that, the chip covers over the through hole, and a surface of the chip is partly exposed out the through hole; a plurality of bonding wires for electrically connecting the chip to the leads; and an encapsulant for encapsulating the chip, the die pad, the bonding wires and part of the leads, wherein the recessed portion of the die pad is completely filled with an encapsulating compound used for forming the encapsulant.

Size and shape of the through hole of the die pad are not particularly limited; the die pad needs to be structured for reducing contact area between the chip and the die pad, and for firmly supporting the chip mounted on the die pad.

The recessed portion of the die pad is necessarily dimensioned in depth greater than largest filler size of the encapsulating compound used for forming the encapsulant. During a molding process, by filling the recessed portion with the encapsulating compound, air trapped in the recessed portion can be completely ventilated without causing voids formed in the recessed portion. Depth of the recessed portion is preferably made to be 1 mil, more preferably greater than 3 mils. The applied amount of adhesive is controlled as to allow a slight amount of adhesive to flash into the recessed portion, which assures contact interface between the chip and the die pad to be free of air or voids, and the adhesive is prevented from further flashing out of the recessed portion and over a bottom surface of the die pad, so that equipment and fabricated products would not be contaminated by the adhesive.

In order to further keep the adhesive in position without causing undesirable flash, a bottom surface of the recessed portion is made to slope from outward to inward; that is, depth of the recessed portion gradually decreases from inward to outward; this allows the adhesive flashing into the recessed portion to be primarily received in the deeper part of the recessed portion. Similarly, the bottom surface of the recessed portion can be formed with a groove, which further effectively helps retaining the adhesive within the recessed portion.

The recessed portion can be formed by conventional half-etching, stamping or bending techniques.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Figure 1:
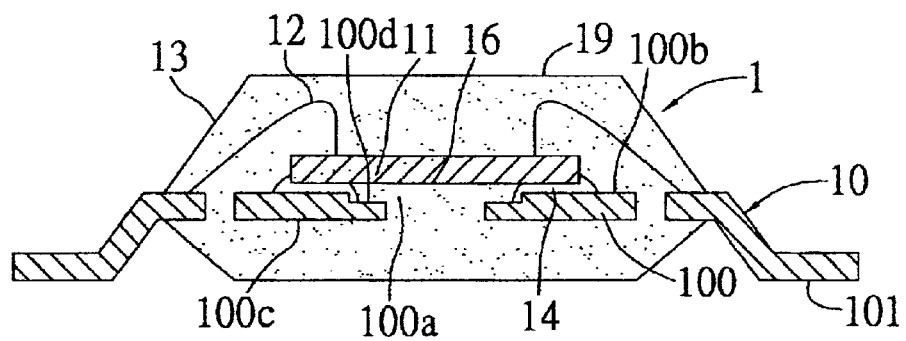
FIG. 1 is a cross-sectional view of a semiconductor package of the invention.

As shown in FIG. 1, a semiconductor package 1 of the present invention comprises: a lead frame 10; a chip 11 mounted on the lead frame 10; a plurality of bonding wires 12 for electrically connecting the chip 11 to the lead frame 10; and an encapsulant 13 for encapsulating the chip 11, the bonding wires 12 and part of the lead frame 10.

The lead frame 10 is composed of a die pad 100 and a plurality of leads 101 formed around the die pad 100. The die pad 100 is formed with a through hole 100a that penetrates through a top surface 100b and a bottom surface 100c of the die pad 100. The number and shape of through hole made for the die pad 100 are not particularly limited. The chip 11 is mounted on the top surface 100b of the die pad 100 by an adhesive 14 such as silver paste in a manner that, the chip 11 needs to entirely cover the through hole 100a (or more than one through hole), and a bottom surface 110C of the chip 11 is partly exposed out the through hole 100a.

A recessed portion 100d is formed at peripheral edge of the through hole 100a in contact with the chip 11, and dents downwardly from the top surface 100b of the die pad 100 as to be associated with the through hole 100a. The recessed portion 100d is dimensioned in depth greater than filler size of an encapsulating resin used for forming the encapsulant 13, so as to allow the encapsulating resin to freely flow into and completely fill the recessed portion 100d during a molding process, after the chip 11 is mounted on the die pad 100. By resin filling of the recessed portion 100d, air trapped therein can be ventilated without causing forming of voids in the recessed portion 100d or generating popcorn effect, when the encapsulant 13 is formed and cured. The recessed portion 100d is preferably around 1 mil, and more preferably larger than 3 mil in depth.

The adhesive 14 is applied for attaching the chip 11 onto the die pad 10 in a control manner that, a slight amount of the adhesive 14 flashes into the recessed portion 100d, so as to assure contact interface between the chip 11 and the die pad 100 to be free of air or voids, and the adhesive 14 is prevented from further flashing out of the recessed portion 100d and over the bottom surface 100c of the die pad 100, so that to equipment and semi-fabricated products would not be contaminated by the adhesive 14 during a die bonding process.

The foregoing semiconductor package 1 is fabricated by a series of processes illustrated in FIGS. 2A to 2E.

Figure 2A:
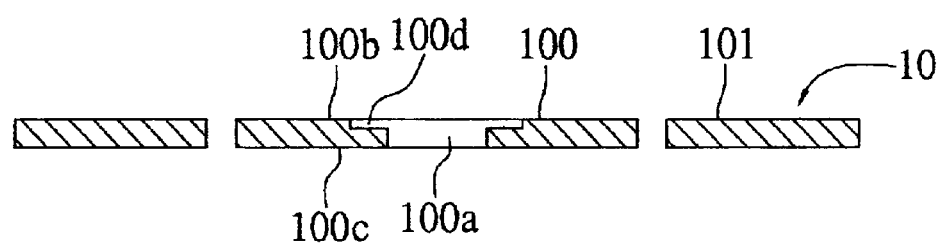
FIGS. 2A–2E are schematic diagrams showing fabrication processes of a semiconductor package of the invention.

Referring to FIG. 2A, the first step is to prepare a lead frame 10 having a die pad 100 and a plurality of leads 101. The die pad 100 is formed with a through hole 100a that penetrates through a top surface 100b and a bottom surface 100c of the die pad 100, and the through hole 100a dents downwardly at its peripheral edge from the top surface 100b to form a recessed portion 100d that is associated with the through hole 100a. The recessed portion 100d is formed by a conventional half-etching or stamping process; as half-etching or stamping technology is well known in the art, it is not to be further detailed herein.

Figure 2B:
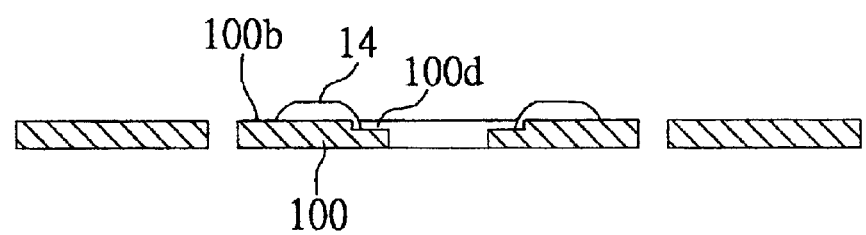

Referring to FIG. 2B, the next step is to apply a suitable amount of adhesive 14 such as silver paste by a conventional technique on the top surface 100b of the die pad 100. The applied amount of adhesive 14 is controlled as to allow a slight amount of adhesive 14 to flow into the recessed portion 100d but not further flash over the bottom surface 100c of the die pad 100, when a chip 11 is attached onto the die pad 100 (as shown in FIG. 2C).

Figure 2C:
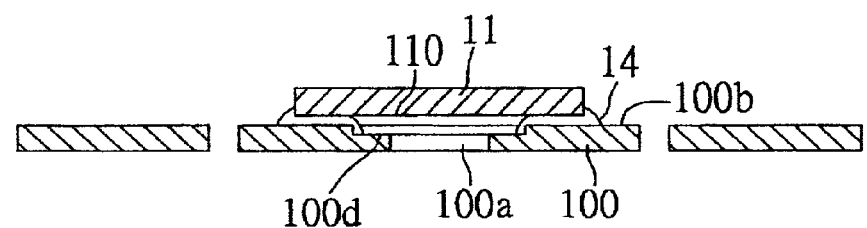

Referring further to FIG. 2C, a die bonding process is performed. A chip 11 is deposited on the top surface 100b of the die pad 100, and adhered with the die pad 100 by the adhesive 14, wherein the chip 11 covers the through hole 100a and a bottom surface 110 of the chip 11 is partly exposed out the through hole 100a. As the adhesive 14 is applied in sufficient amount over entire contact area between the chip 11 and the die pad 100, and also slightly fills into the recessed portion 100d, after the chip 11 is firmly mounted on the die pad 100, contact interface between the chip 11 and the die pad 100 can be assured to be free of air or voids. In the meantime, as the adhesive 14 is prevented from further flashing out of the recessed portion 100d and over the bottom surface 100c of the die pad 100, equipment or semi-fabricated products would not be undesirably contaminated by the adhesive 14 during the die bonding process.

Figure 2D:
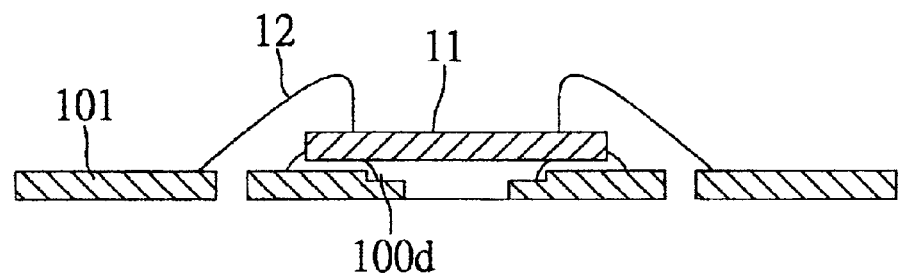

Referring to FIG. 2D, a wire bonding process is performed to electrically connect the chip 11 to the lead frame 10, wherein a plurality of gold wires 12 are formed to electrically couple the chip 11 to corresponding leads 101 of the lead frame 10. Since the wire bonding process is conventional technology, no further description is to be repeated herein.

Figure 2E:
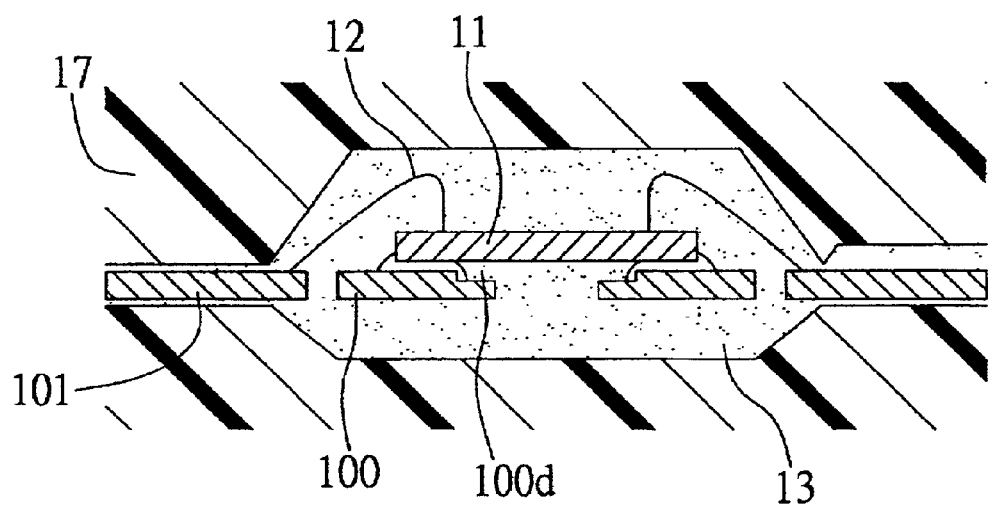

Referring finally to FIG. 2E, the wire-bonded semi-fabricated product is placed into a mold 17 where an encapsulating resin is used to form an encapsulant 13 for encapsulating the chip 11, the die pad 100, the leads 101 and the gold wires 12. Part of the leads 101 each is partly exposed to outside of the encapsulant 13. After the molding process, the exposed portions of the leads 101 are subsequently connected to an external device such as a printed circuit board (not shown), by which the chip 11 can be electrically associated with the external device for subsequent operation. This molding process for forming the encapsulant 13 is well known in the art, and not to be further discussed herein.

After the molding process, the encapsulant 13 is cured, and the semiconductor package 1 of the invention shown in FIG. 1 is completely fabricated. Subsequent trimming, marking and forming processes performed for the semiconductor package 1 are the same as conventionally used in the art, and not to be further detailed herein.

FIGS. 3A to 3H illustrate various embodiments of a lead frame used in the semiconductor package of the invention. In simplicity, the same parts of various embodiments as the lead frame shown in FIG. 1 are not repetitively exemplified, and only structural differences of design are here depicted and clarified.

Figure 3A:
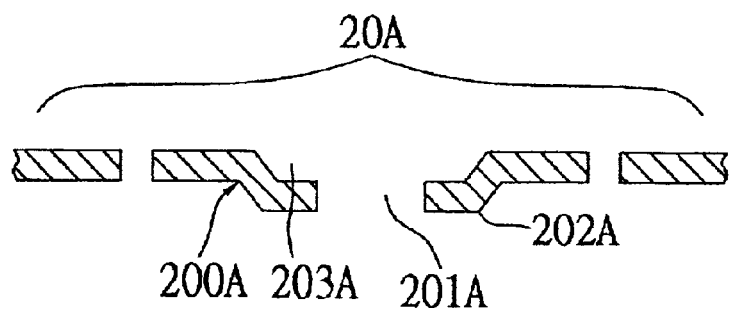
FIGS. 3A–3H are schematic diagrams showing various embodiments of a lead frame used in a semiconductor package of the invention.

Referring to FIG. 3A, a die pad 200A of a lead frame 20A is formed with a through hole 201A, and peripheral edge of the through hole 201A is bent downwardly to form a down-set section 202A, which accordingly defines a recessed portion 203A that can retain part of an adhesive (not shown) used for attaching a chip (not shown) onto the die pad 200A, and prevent the adhesive from flashing out of the recessed portion 203A and from flowing out to a bottom surface of the die pad 200A.

Figure 3B:
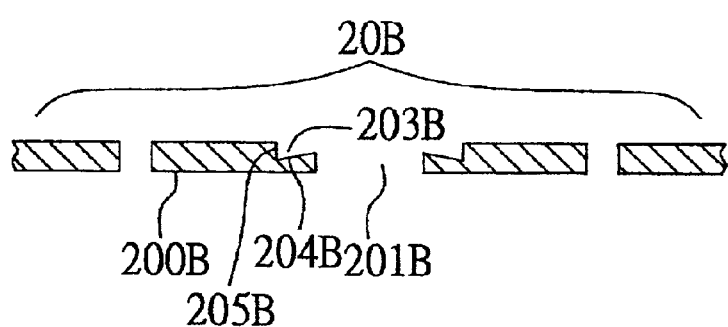

Referring to FIG. 3B, a die pad 200B of a lead frame 20B is formed with a through hole 201B, peripheral edge of which through hole 201B is half-etched or stamped to form a recessed portion 203B. Unlike the one shown in FIG. 1, the recessed portion 203B has its bottom surface 204B sloping downwardly toward a vertical side 205B of the recessed portion 203B; in other words, depth of the recessed portion 203B is decreasing from the vertical side 205B to the through hole 201B. This structural design can further effectively prevent an adhesive (not shown) from continuously flashing out of the recessed portion 203B in a direction toward the through hole 201B.

Figure 3C:
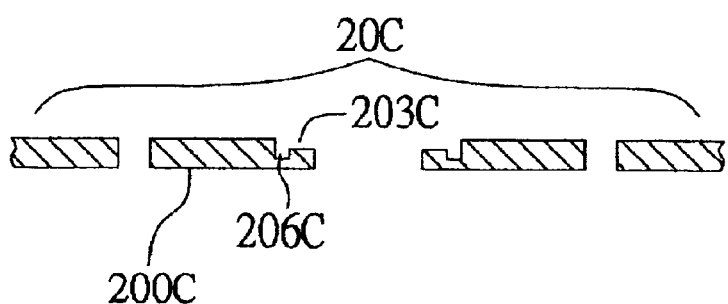

Referring to FIG. 3C, an illustrated lead frame 20C is similar in structure to the one shown in FIG. 1 and differs in that, a recessed portion 203C formed on a die pad 200C of the lead frame 20C has its bottom surface further denting to form a groove 206C, which provides the recessed portion 203C with more space for receiving an adhesive (not shown) that fills inside the recessed portion 203C. More than one groove 206C can be structured, or the bottom surface of the recessed portion 203C can be made uneven, so as to further impede flashing of the adhesive out of the die pad 200C.

Figure 3D:
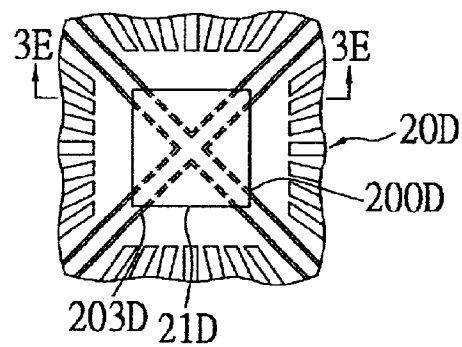
Figure 3E:
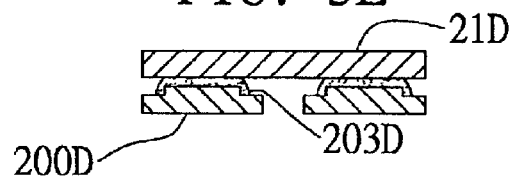

Referring to FIG. 3D, a die pad 200D of a lead frame 20D is X-shaped, and dimensioned in surface area smaller than a chip 21D mounted thereon, with at least a recessed portion 203D being formed at peripheral edge of the die pad 200D. Shaping of the die pad 200D helps reduce contact area between the chip 21D and the die pad 200D, whereby thermal stress applied from the die pad 200D to the chip 21D can be significantly diminished. FIG. 3E illustrates a cross-sectional view of FIG. 3D cutting along a line 3E—3E.

Figure 3F:
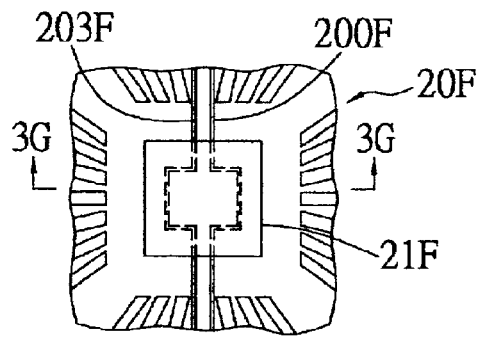
Figure 3G:
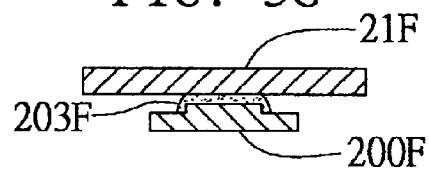

Referring to FIG. 3F, a die pad 200F of a lead frame 20F is strip-shaped, and an enlarged portion is formed at a middle part of the die pad 200F, so as to provide sufficient mechanical strength for supporting a chip 21F mounted on the die pad 200F, wherein the chip 21F is larger in surface area than the die pad 200F. Also, peripheral edge of the die pad 200F dents to form at least a recessed portion 203F, which helps prevent an adhesive used for attaching the chip 21F onto the die pad 200F, from flashing out of the die pad 200F. FIG. 3G illustrates a cross-sectional view of FIG. 3F cutting along a line 3G—3G.

Figure 3H:
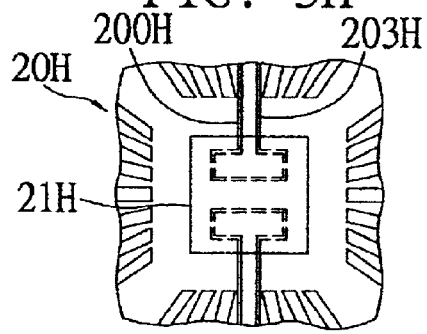
Figure 4A:
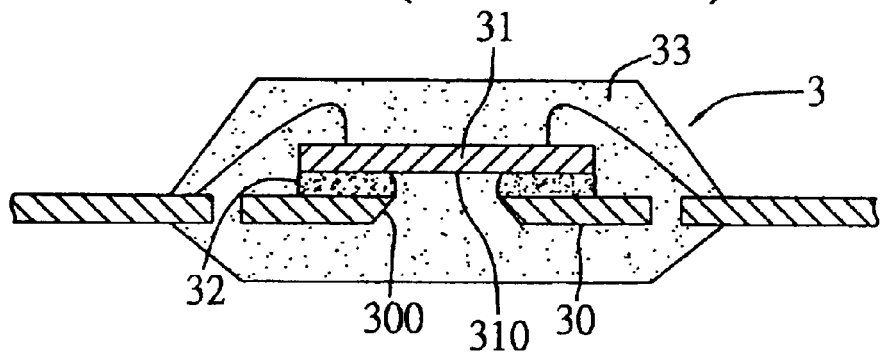
FIG. 4A (PRIOR ART) is a cross-sectional view of a conventional semiconductor package.
Figure 4B:
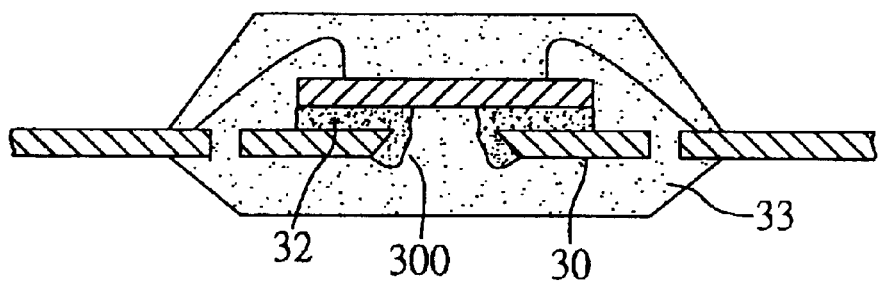
FIG. 4B (PRIOR ART) is a schematic diagram showing silver paste used for attaching a chip onto a die pad, flashing into a through hole of the die pad in the semiconductor package of FIG. 4A.
Figure 4C:
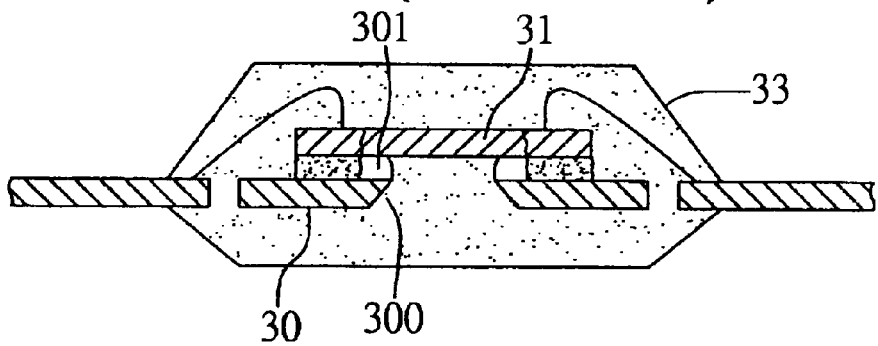
FIG. 4C (PRIOR ART) is a schematic diagram showing a gap formed between the chip and the die pad in the semiconductor package of FIG. 4A.
Figure 5:
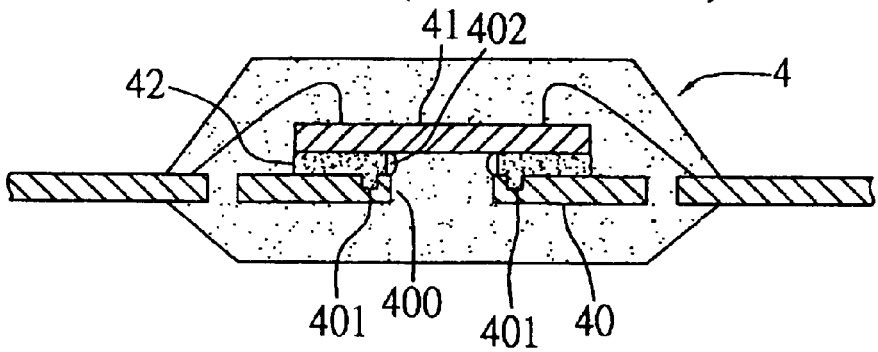
FIG. 5 (PRIOR ART) is a cross-sectional view of another conventional semiconductor package.

Referring to FIG. 3H, a die pad 200H of a lead frame 20H is formed in a separate type; that is, the die pad 200H is composed of two opposing halves properly spaced apart from each other, which can further reduce contact area between the die pad 200 H and a chip 21H mounted on the die pad 200H, and also diminish thermal stress applied from the die pad 200H to the chip 21H. Similarly, peripheral edge of the die pad 200H dents to form at least a recessed portion 203H for preventing the occurrence of adhesive flashing out of the die pad 200H, which adhesive is used to attach the chip 21H onto the die pad 200H.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a die pad having a recessed portion, comprising:

a lead frame having the die pad and a plurality of leads, the die pad being formed with at least a through hole and the recessed portion that dents from a top surface of the die pad and is connected to the through hole, wherein a bottom surface of the recessed portion slopes in a direction away from the through hole, such that a depth of the recessed portion gradually increases away from the through hole;

a chip mounted on the die pad by an adhesive in a manner that the chip covers over the through hole, and a surface of the chip is partly exposed out the through hole;

a plurality of conductive elements for electrically connecting the chip to the leads; and an encapsulant for encapsulating the chip, the die pad, the conductive elements and part of the leads, wherein the recessed portion of the die pad is filled with the encapsulant.

2. The semiconductor package of claim 1, wherein the recessed portion of the die pad is dimensioned in depth greater than largest filler size of an encapsulating compound used for forming the encapsulant.

3. The semiconductor package of claim 1, wherein the adhesive is applied in sufficient amount as to allow contact interface between the chip and the die pad to be free of voids, and allow a slight amount of the adhesive to flash into the recessed portion of the die pad.

4. The semiconductor package of claim 1, wherein the conductive elements are bonding wires.

5. The semiconductor package of claim 4, wherein the bonding wires are gold wires.

6. A semiconductor package with a die pad having at least a recessed portion, comprising:

a lead frame having the die pad and a plurality of leads, wherein the recessed portion is formed at the peripheral edges of the die pad and dents from a top surface of the die pad, and a bottom surface of the recessed portion slopes in a direction away from the peripheral edge of the die pad, such that a depth of the recessed portion gradually increases away from the peripheral edge;

a chip mounted on the die pad by an adhesive, and dimensioned larger in surface area than the die pad;

a plurality of conductive elements for electrically connecting the chip to the leads; and an encapsulant for encapsulating the chip, the die pad, the conductive elements and part of the leads, wherein each recessed portion of the die pad is filled with the encapsulant.

7. The semiconductor package of claim 6, wherein the recessed portion of the die pad is dimensioned in depth greater than largest filler size of an encapsulating compound used for forming the encapsulant.

8. The semiconductor package of claim 6, wherein the adhesive is applied in sufficient amount as to allow contact interface between the chip and the die pad to be free of voids, and allow a slight amount of the adhesive to flash into the recessed portions of the die pad.

9. The semiconductor package of claim 6, wherein the conductive elements are bonding wires.

10. The semiconductor package of claim 9, wherein the bonding wires are gold wires.

11. The semiconductor package of claim 6, wherein the die pad is X-shaped.

12. The semiconductor package of claim 6, wherein the die pad is strip-shaped, and a middle part of the die pad is formed with an enlarged portion.

13. The semiconductor package of claim 6, wherein the die pad is composed of two opposing halves properly spaced apart from each other.

* * * * *